United States Patent
Fan

(10) Patent No.: US 9,536,812 B2
(45) Date of Patent: Jan. 3, 2017

(54) CAVITY PACKAGE WITH PRE-MOLDED CAVITY LEADFRAME

(71) Applicant: Ubotic Company Limited, Tsuen Wan (CN)

(72) Inventor: Chun Ho Fan, Tsuen Wan (CN)

(73) Assignee: UBOTIC COMPANY LIMITED, Hong Kong (CN)

( * ) Notice: Subject to any disclaimer, the term of this patent is extended or adjusted under 35 U.S.C. 154(b) by 0 days.

(21) Appl. No.: 14/993,175

(22) Filed: Jan. 12, 2016

(65) Prior Publication Data
US 2016/0126164 A1    May 5, 2016

Related U.S. Application Data

(62) Division of application No. 14/446,390, filed on Jul. 30, 2014, now Pat. No. 9,257,370.
(Continued)

(51) Int. Cl.
*H01L 23/047* (2006.01)
*H01L 23/495* (2006.01)
(Continued)

(52) U.S. Cl.
CPC ..... *H01L 23/49503* (2013.01); *H01L 21/4825* (2013.01); *H01L 21/50* (2013.01); *H01L 21/565* (2013.01); *H01L 21/78* (2013.01); *H01L 23/047* (2013.01); *H01L 23/10* (2013.01); *H01L 23/3114* (2013.01); *H01L 23/4952* (2013.01); *H01L 23/49541* (2013.01);
(Continued)

(58) Field of Classification Search
CPC ............... H01L 23/49503; H01L 23/49582; H01L 23/49575; H01L 23/047; H01L 23/49861

USPC ......................................... 257/670
See application file for complete search history.

(56) References Cited

U.S. PATENT DOCUMENTS 3,970,880 A * 7/1976 Deutschmann ....... H01L 41/053
                                                   310/344
4,692,790 A * 9/1987 Oyamada ............. H05K 7/1061
                                                   257/727
(Continued)

FOREIGN PATENT DOCUMENTS

WO    2011/103720 A1    9/2011

OTHER PUBLICATIONS

Fan, "Cavity Package with Pre-Molded Cavity LeadFrame", U.S. Appl. No. 14/446,390, filed Jul. 30, 2014.
(Continued)

*Primary Examiner* — Nathan W Ha
(74) *Attorney, Agent, or Firm* — Keating and Bennett, LLP

(57) ABSTRACT

A cavity package is disclosed comprising a metal leadframe, a metal ring connected to the metal leadframe, a plastic body molded to the metal leadframe forming a substrate cavity including an exposed die attach pad of the leadframe for affixing a semiconductor device, exposed lead fingers of the leadframe for wire bonding to the semiconductor device and an external circuit, and an exposed top surface of the metal ring, and a metal cap for closing and encapsulating the substrate cavity. The metal ring is integrated into the pre-molded cavity leadframe for providing an electrical ground path from the metal cap to the die attach pad and permitting attachment of the metal cap to the pre-molded leadframe using solder reflow.

4 Claims, 12 Drawing Sheets

Related U.S. Application Data

(60) Provisional application No. 61/870,354, filed on Aug. 27, 2013.

(51) Int. Cl.

| | |
|---|---|
| *H01L 23/10* | (2006.01) |
| *H01L 23/498* | (2006.01) |
| *H01L 21/50* | (2006.01) |
| *H01L 23/00* | (2006.01) |
| *H01L 21/48* | (2006.01) |
| *H01L 21/56* | (2006.01) |
| *H01L 21/78* | (2006.01) |
| *H01L 23/31* | (2006.01) |

(52) U.S. Cl.
CPC .. *H01L 23/49575* (2013.01); *H01L 23/49582* (2013.01); *H01L 23/49861* (2013.01); *H01L 24/97* (2013.01); H01L 23/49537 (2013.01); H01L 24/32 (2013.01); H01L 24/48 (2013.01); H01L 24/73 (2013.01); H01L 24/85 (2013.01); H01L 24/92 (2013.01); H01L 2224/32245 (2013.01); H01L 2224/48247 (2013.01); H01L 2224/48257 (2013.01); H01L 2224/73265 (2013.01); H01L 2224/85439 (2013.01); H01L 2224/85444 (2013.01); H01L 2224/85455 (2013.01); H01L 2224/85464 (2013.01); H01L 2224/92247 (2013.01); H01L 2224/97 (2013.01); H01L 2924/15153 (2013.01); H01L 2924/15747 (2013.01); H01L 2924/165 (2013.01); H01L 2924/167 (2013.01); H01L 2924/1659 (2013.01); H01L 2924/16251 (2013.01)

(56) References Cited

U.S. PATENT DOCUMENTS

| | | | | |
|---|---|---|---|---|
| 4,992,628 | A | * | 2/1991 | Beppu ............... H01L 23/057 174/530 |
| 5,038,248 | A | * | 8/1991 | Meyer ................ H01L 23/60 206/719 |
| 5,278,447 | A | * | 1/1994 | Vongfuangfoo ...... H01L 23/562 257/678 |
| 5,426,405 | A | * | 6/1995 | Miller ............... H01L 23/4006 257/726 |
| 5,792,984 | A | * | 8/1998 | Bloom ............... H01L 23/10 174/536 |
| 8,063,470 | B1 | | 11/2011 | Sirinorakul et al. |
| 2011/0140253 | A1 | | 6/2011 | Lee et al. |

OTHER PUBLICATIONS

Non-Final Rejection dated Jul. 29, 2016 for U.S. Appl. No. 14/469,811.

Non-Final Rejection dated Jan. 14, 2016 in Related U.S. Appl. No. 14/469,811.

\* cited by examiner

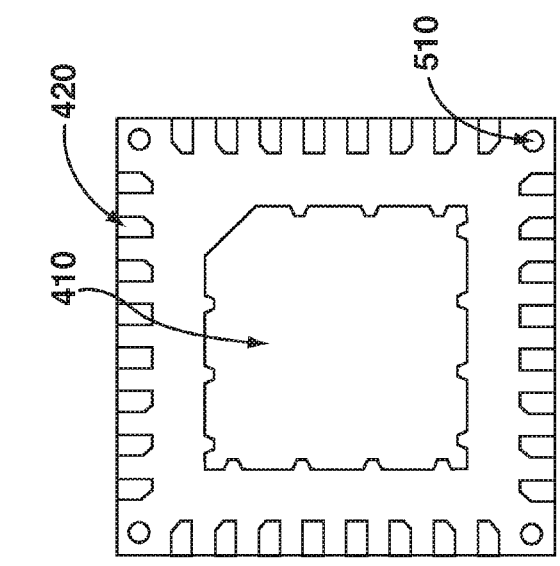
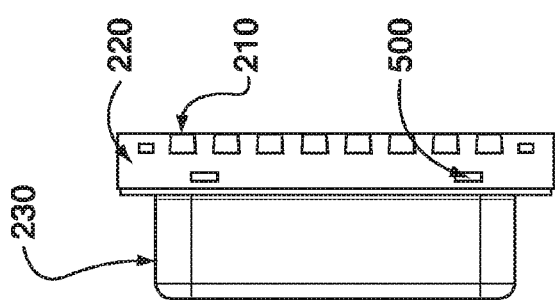
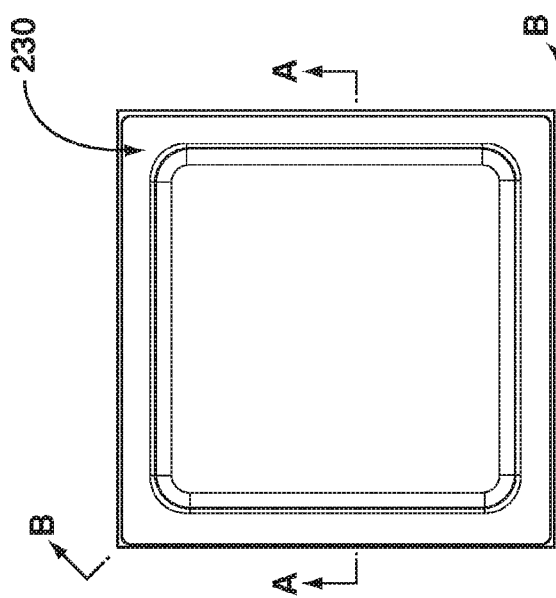
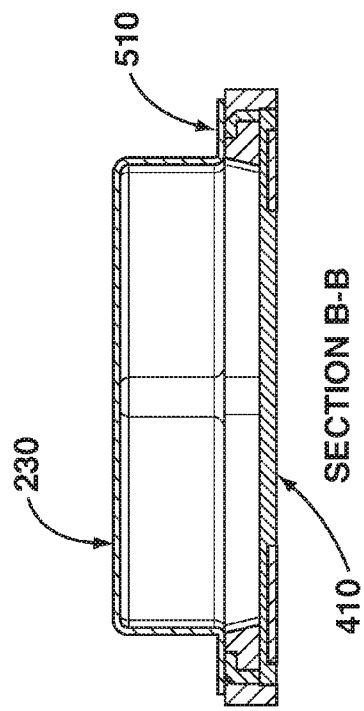
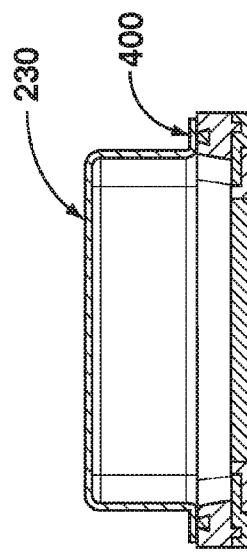

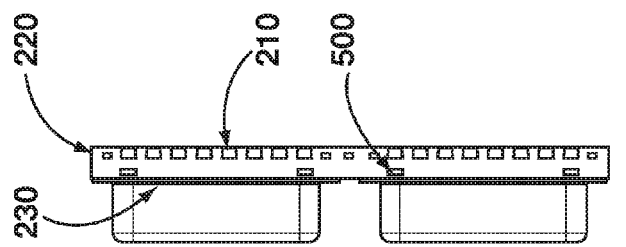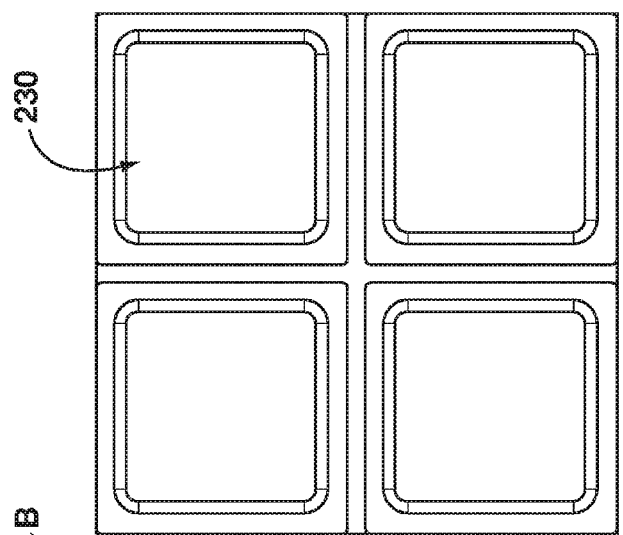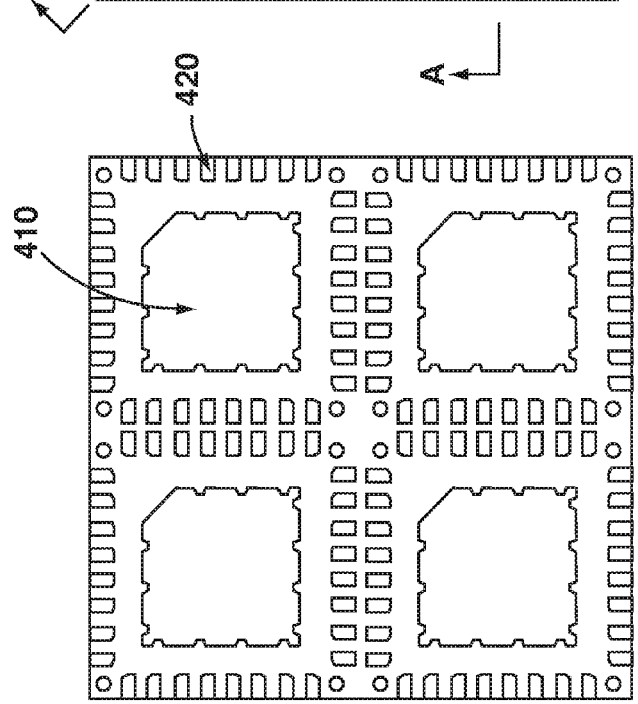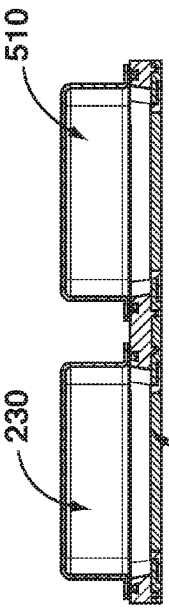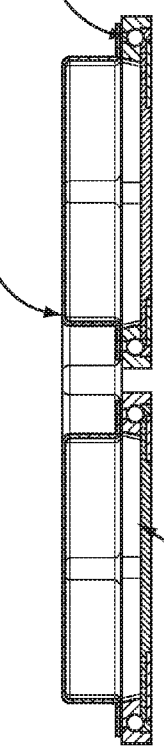

CAVITY PACKAGE WITH PRE-MOLDED CAVITY LEADFRAME

RELATED APPLICATIONS

This application claims priority from U.S. patent application 61/870,354, filed Aug. 27, 2013. Priority is claimed to this earlier filed application and the contents of this earlier-filed application are incorporated herein, in their entirety, by reference.

FIELD OF INVENTION

The present invention relates generally to integrated circuits, and more particularly to a cavity package with a pre-molded cavity leadframe.

BACKGROUND

Flat no-leads packages such as QFN (quad-flat no-leads) and DFN (dual-flat no-leads) are used to physically and electrically connect integrated circuits to printed circuit boards. Two types of flat no-leads packages are common: cavity (i.e. with a cavity designed into the package containing air or nitrogen), and plastic-molded (i.e. with minimal air in the package). The cavity package is usually made up of three parts; a copper leadframe, plastic-molded body (open, and not sealed), and a cap or lid attached to the plastic portion of the leadframe. An integrated circuit (IC) is mounted to a die attach pad within the cavity, with wire leads connecting the IC to the leadframe. The leadframe terminates in contacts on the bottom of the package for providing electrical interconnection with a printed circuit board.

Cavity packages are small and lightweight, with good thermal and electrical performance that makes them suitable for portable communication/consumer products. Applications include cellular phones, PDAs, wireless transmitters, RF front end, HD devices, microcontrollers, pre-amplifiers, servers, smart power suppliers, switches, DSPs, ASICs and wrist watches.

SUMMARY

According to an aspect of the invention, a metal ring is integrated into the pre-molded cavity leadframe. The metal ring provides an electrical ground path from the metal cap to the die attach pad and permits attachment of the metal cap to the pre-molded leadframe using solder reflow onto.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIG. 5A is a top view of the cavity package with pre-molded cavity leadframe of FIGS. 2A and 2B.

FIG. 5B is a side view of the cavity package with pre-molded cavity leadframe of FIGS. 2A and 2B.

FIG. 5C is a bottom view of the cavity package with pre-molded cavity leadframe of FIGS. 2A and 2B.

FIG. 5D is a cross-sectional view of the cavity package with pre-molded cavity leadframe along the line A-A in FIG. 5A.

FIG. 5E is a cross-sectional view of the cavity package with pre-molded cavity leadframe along the line B-B in FIG. 5A.

FIG. 13A is a bottom view of a pre-molded leadframe matrix according to an alternative embodiment, wherein solder balls are used to attach the frame of seal rings to the leadframe matrix.

FIG. 13B is a top view of the pre-molded leadframe matrix of FIG. 13A.

FIG. 13C is a side view of the pre-molded leadframe matrix of FIG. 13A.

FIG. 13D is a cross-sectional view of the pre-molded leadframe matrix along the line A-A in FIG. 13B.

FIG. 13E is a cross-sectional view of the pre-molded leadframe matrix along the line B-B in FIG. 13B.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENTS

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

With reference to FIGS. 1 through 13, construction of a cavity package 200 with a pre-molded cavity leadframe is shown, according to an exemplary embodiment.

As discussed above, and as shown in FIGS. 2A and 2B, the cavity package 200 comprises a copper leadframe 210, a plastic-molded body 220, and a lid or cap 230.

Figure 3A:
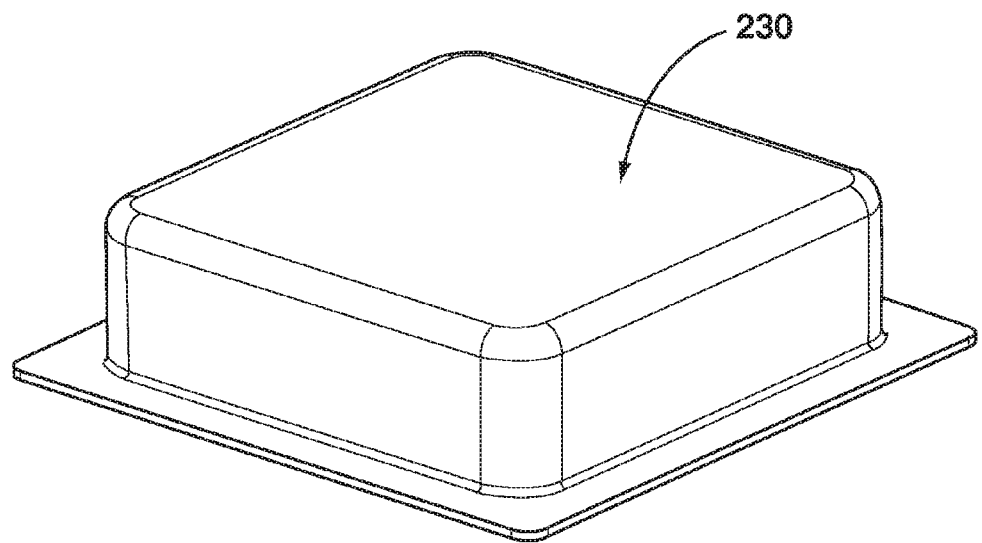
FIGS. 3A and 3B are top and bottom perspective views, respectively, of a cap for the cavity package of FIGS. 2A and 2B.
Figure 3B:
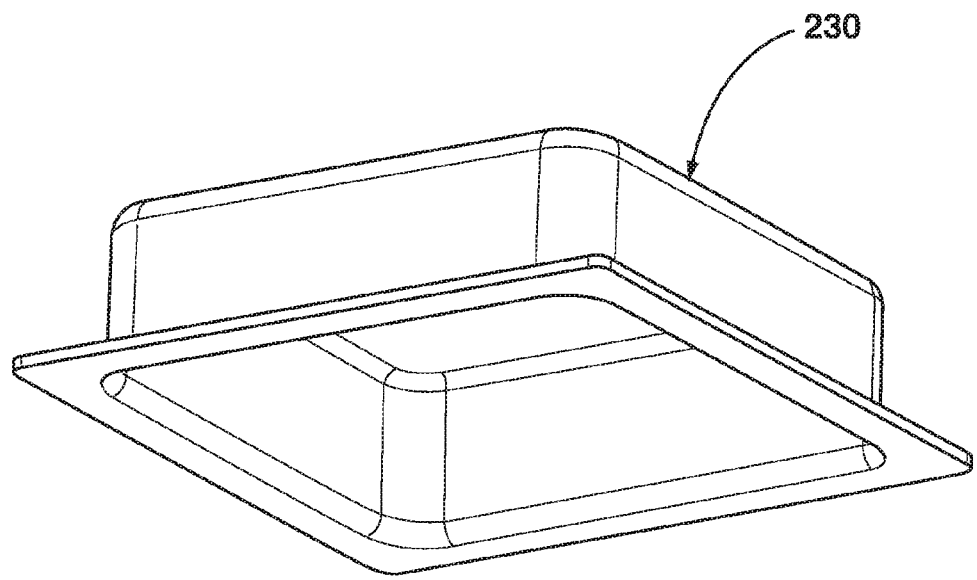

FIGS. 3A and 3B show the cap 230 used to enclose the attached semiconductor die within the pre-molded leadframe.

Figure 4A:
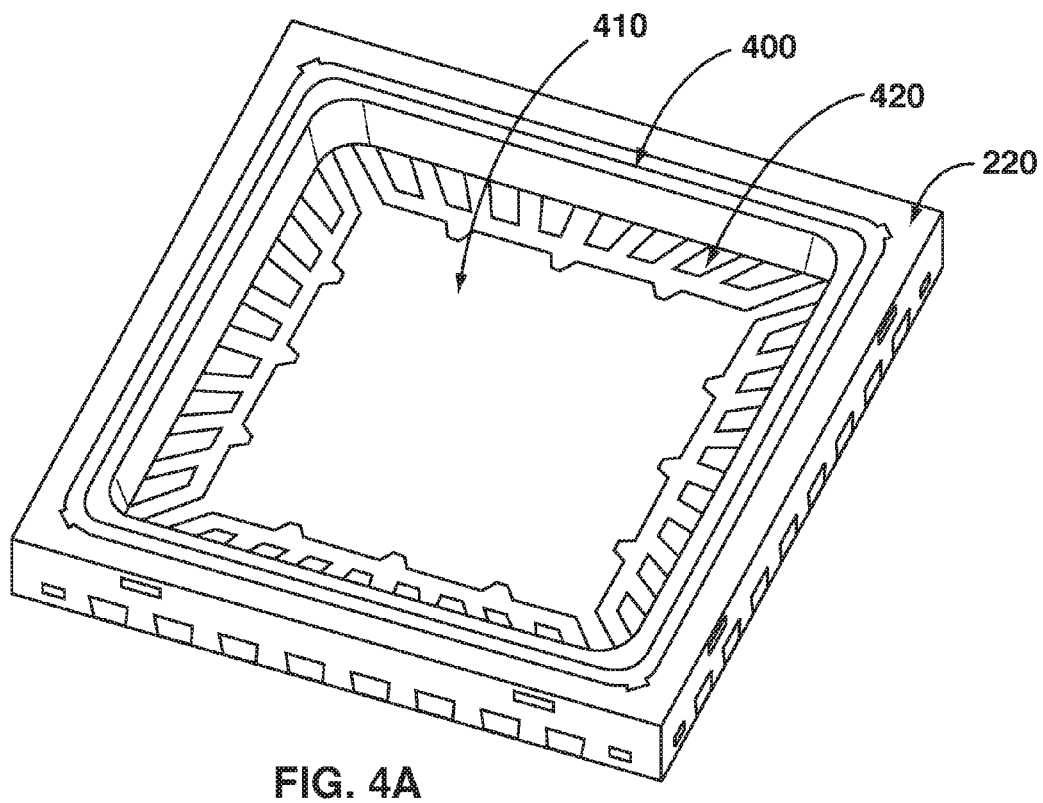
FIGS. 4A and 4B are top and bottom perspective views, respectively, of a pre-molded cavity leadframe for the cavity package of FIGS. 2A and 2B.
Figure 4B:
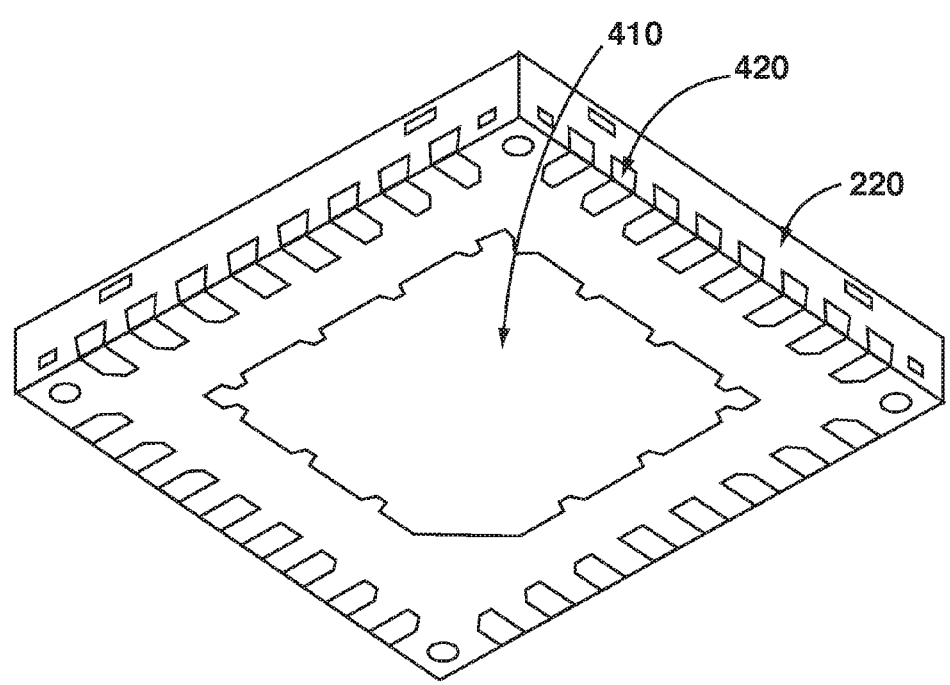

FIGS. 4A and 4B show the pre-molded leadframe comprising copper leadframe 210 molded within body 220, including a seal ring 400, exposed die attach pad 410, and exposed lead fingers 420 for wire bonding to the semiconductor device at the top surface and for soldering to an external circuit such as a PCB board, at the bottom surface thereof.

Figure 2A:
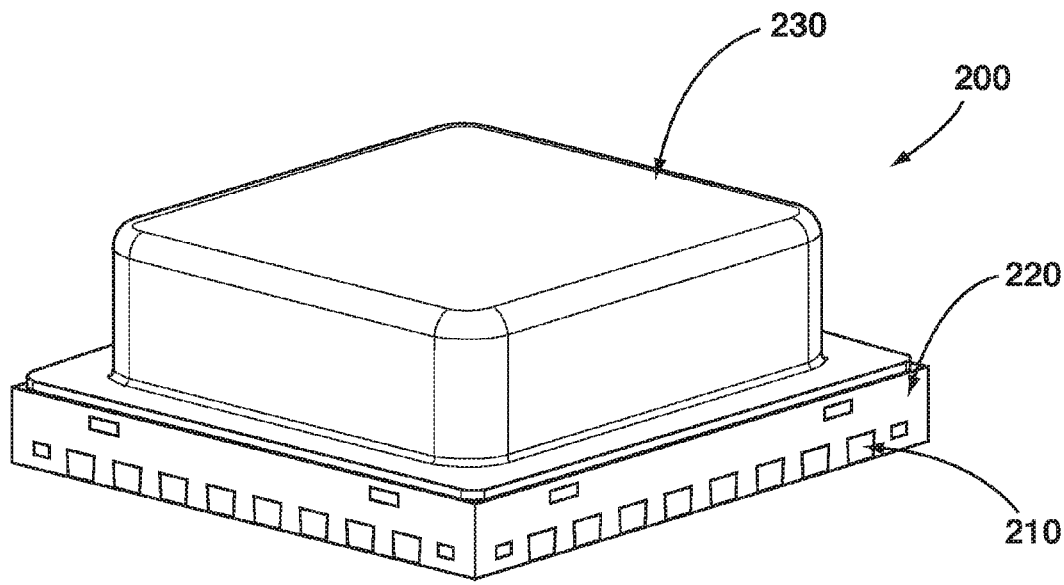
FIGS. 2A and 2B are top and bottom perspective views, respectively, of a cavity package with a pre-molded cavity leadframe, according to an exemplary embodiment.
Figure 2B:
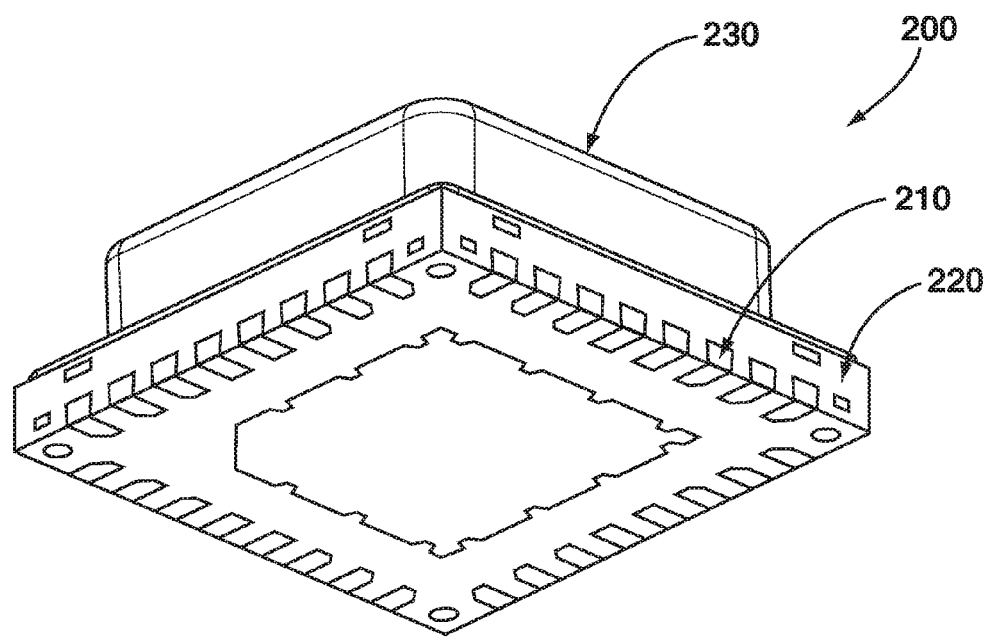

FIG. 5A is a top view of the cavity package with pre-molded cavity leadframe of FIGS. 2A and 2B, while FIG. 5B is a side view, FIG. 5C is a bottom view, FIG. 5D is a cross-sectional view along the line A-A in FIG. 5A, and FIG. 5E is a cross-sectional view along the line B-B in FIG. 5A.

Figure 1:
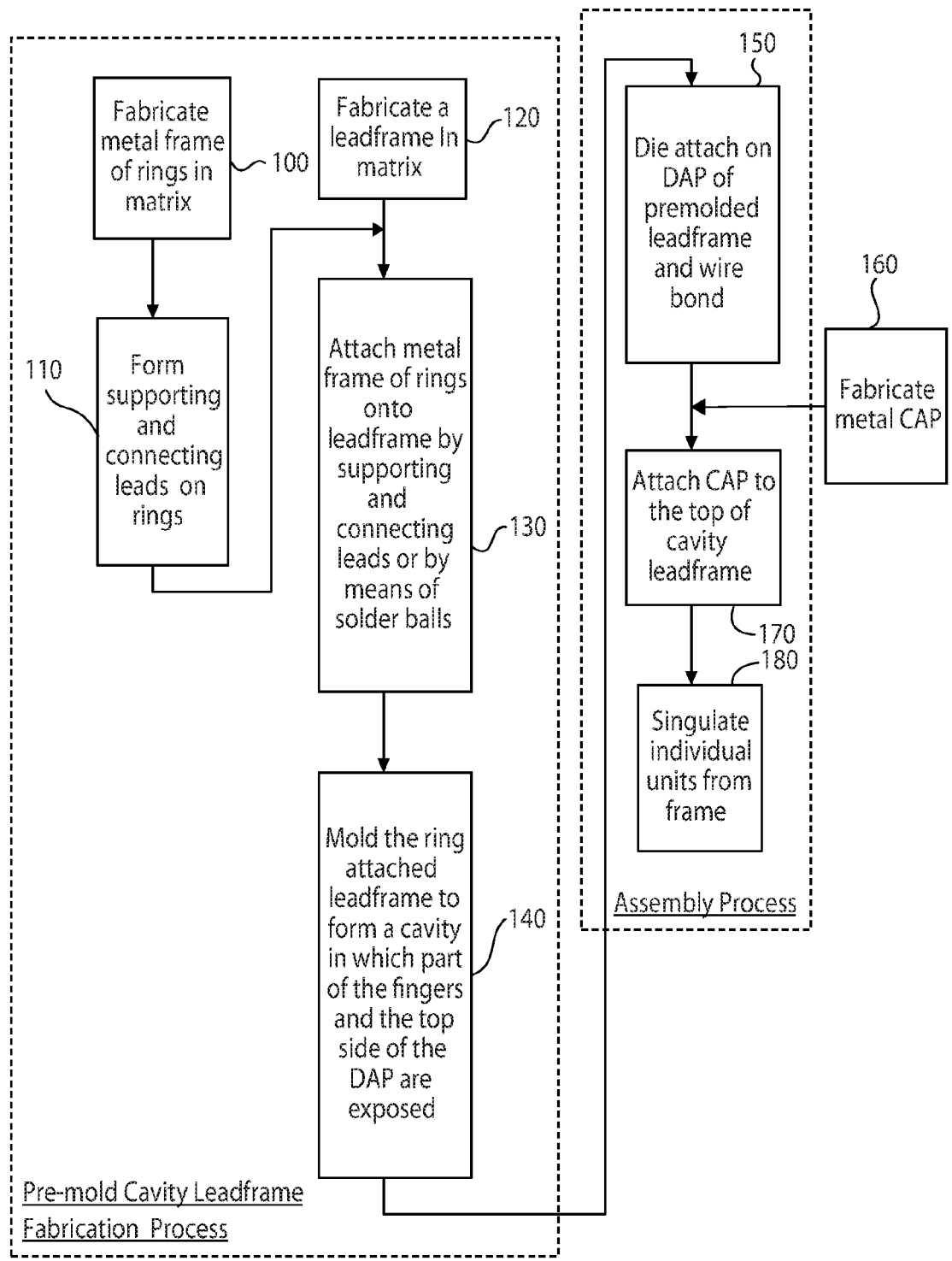
FIG. 1 is a flowchart showing steps in a process for constructing a cavity package with a pre-molded cavity leadframe, according to exemplary embodiments.

Construction of the cavity package involves a two-part process beginning with pre-mold cavity leadframe fabrication, followed by assembly, as shown in FIG. 1.

Figure 6A:
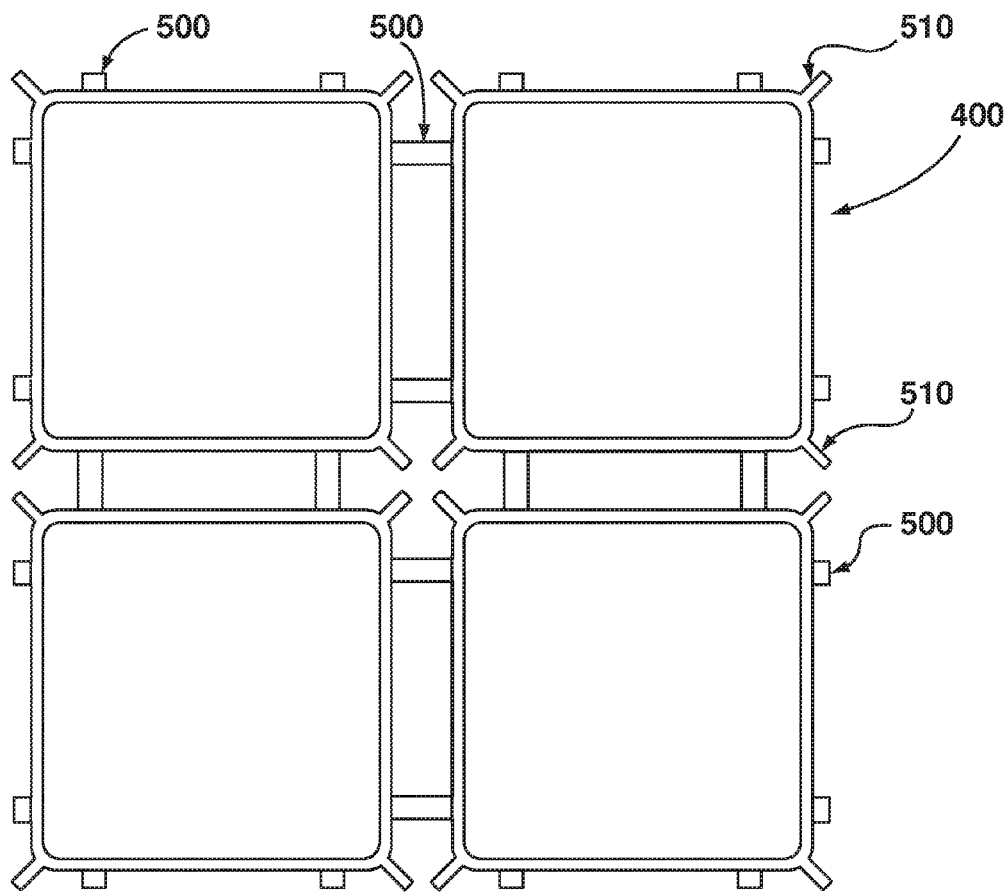
FIGS. 6A and 6B are top and perspective views, respectively, of a frame of seal rings fabricated in a matrix, according to one step of the process set forth in FIG. 1.
Figure 6B:
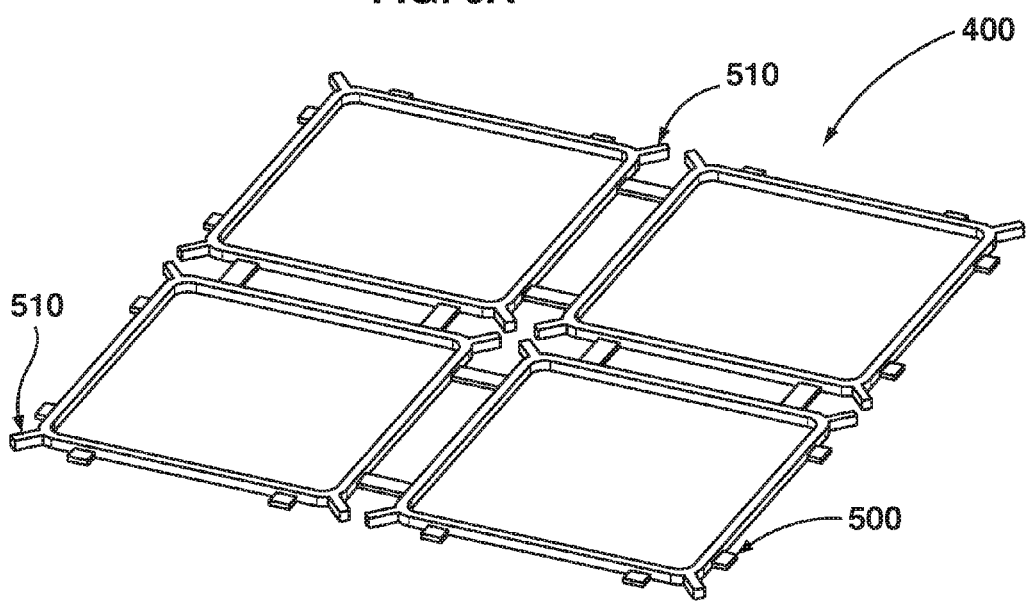
Figure 7A:
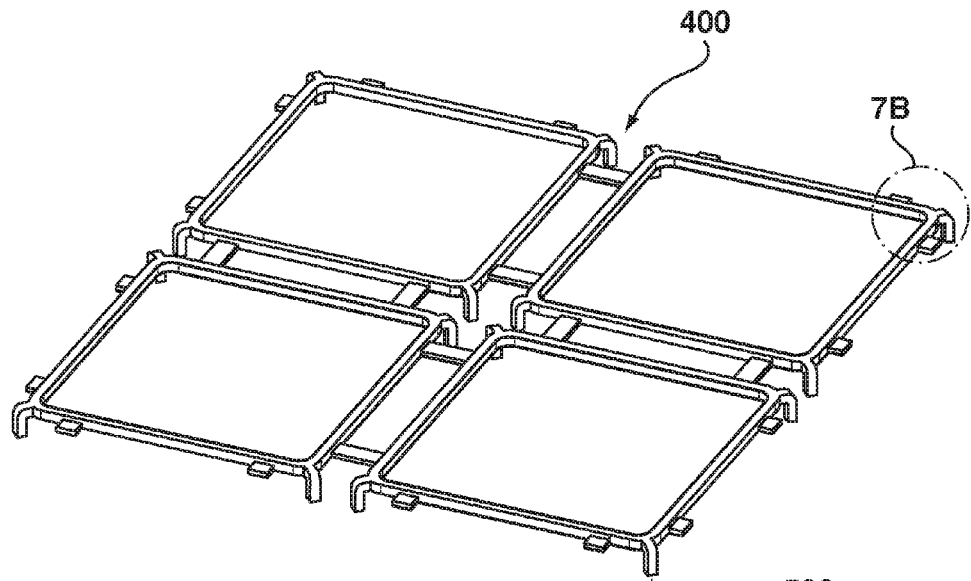
FIGS. 7A and 7B are a top perspective and a detail view, respectively, of the matrix of seal rings with supporting and connecting leads formed according to a further step of the process set forth in FIG. 1.
Figure 7B:
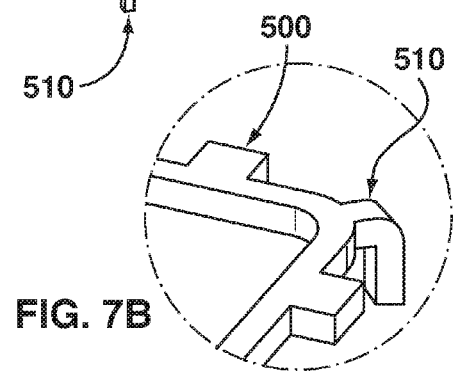

The pre-mold cavity leadframe fabrication begins at step 100 (FIG. 1) with etching or stamping of a metal (e.g. Cu, alloy 42, Al, etc.) frame of rings 400 that are held together by half-etched temporary tie bars 500, as shown in FIGS. 6A-6B. Each ring 400 includes supporting and connecting leads 510. Optionally, the frame of rings 400 can be plated by a solderable metal (e.g. Ag, Sn/Au, etc.)

At step 110, the supporting and connecting leads 510 are shaped by mechanical bending, for example using a punch tool and anvil block, so that the matrix of rings 'stands' on leads 510 at an appropriate height above the leadframe 200, as discussed in greater detail below.

Figure 8:
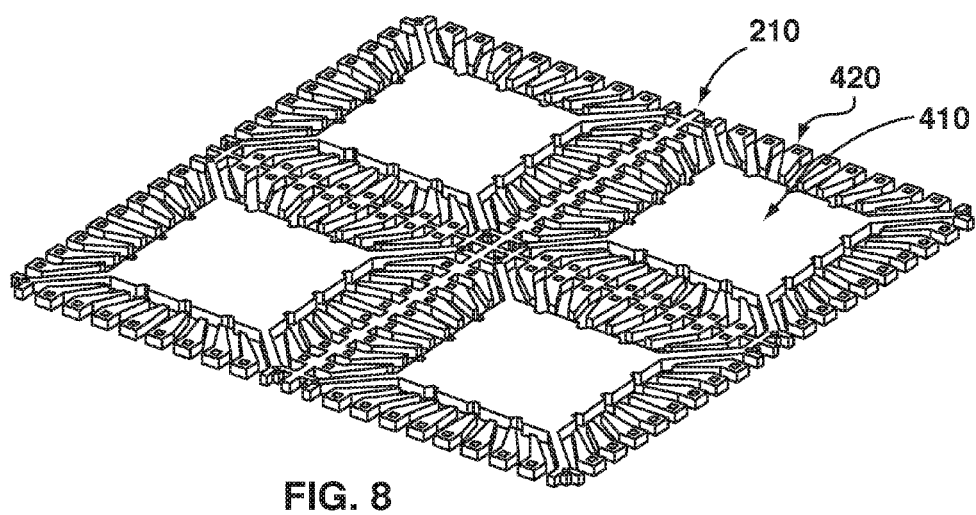
FIG. 8 is a perspective view of a matrix of bottom leadframes fabricated according to a further step of the process set forth in FIG. 1.

At step 120, the leadframe 210 is fabricated in a matrix, as shown in FIG. 8. Step 120 can be performed before, after or simultaneously with step 100 or step 110.

Figure 9A:
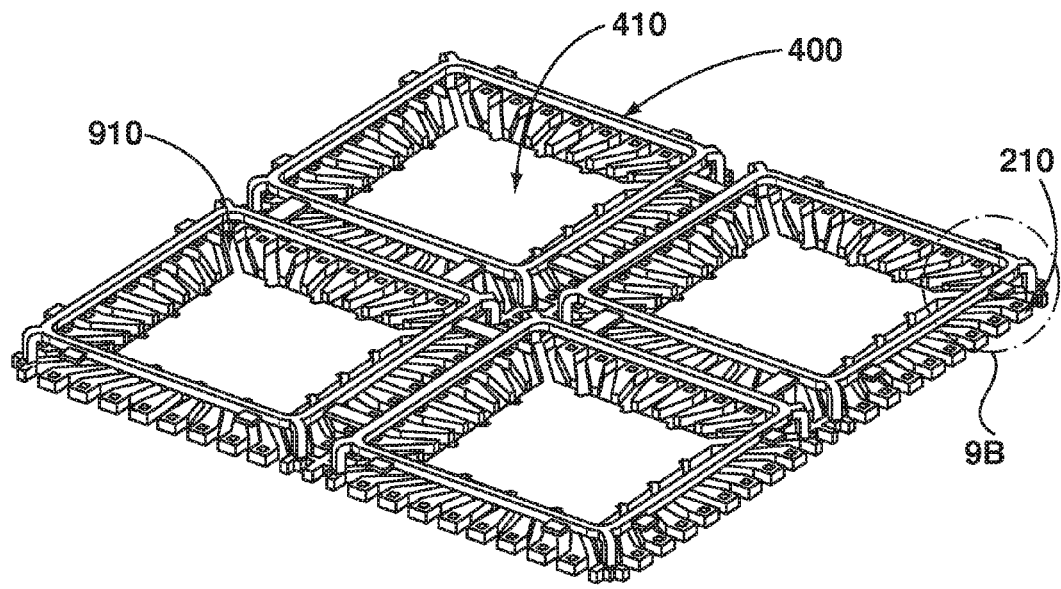
FIGS. 9A and 9B are a top perspective and a detail view, respectively, showing attachment of the frame of seal rings to the leadframe matrix via the supporting and connecting leads, according to a further step of the process set forth in FIG. 1.
Figure 9B:
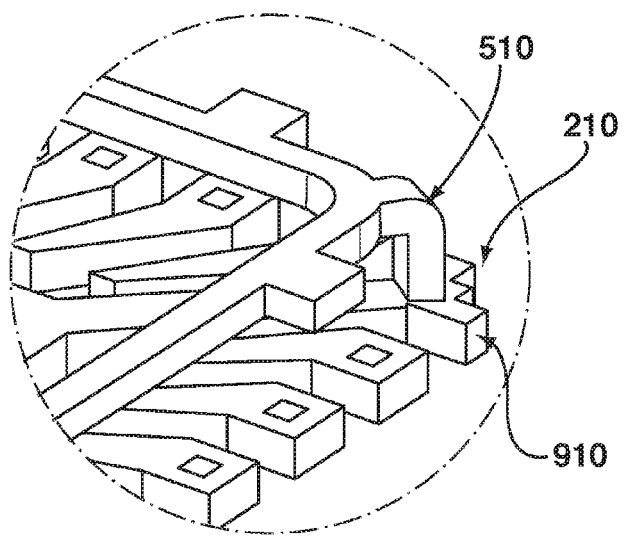

At step 130, the metal frame of rings 400 is mechanically and electrically connected to the leadframe 210 (e.g. by conductive epoxy, soldering, spot welding, etc.), as shown in FIGS. 9A and 9B. The leads 510 are used to support the rings and prevent the structure from collapsing as a result of clamping pressure by the mold tool during a subsequent molding step. The ring 400 is electrically connected to the tie bar 910 of the die attach pad 410 for later electrical connection to the metal cap 230.

Figure 10A:
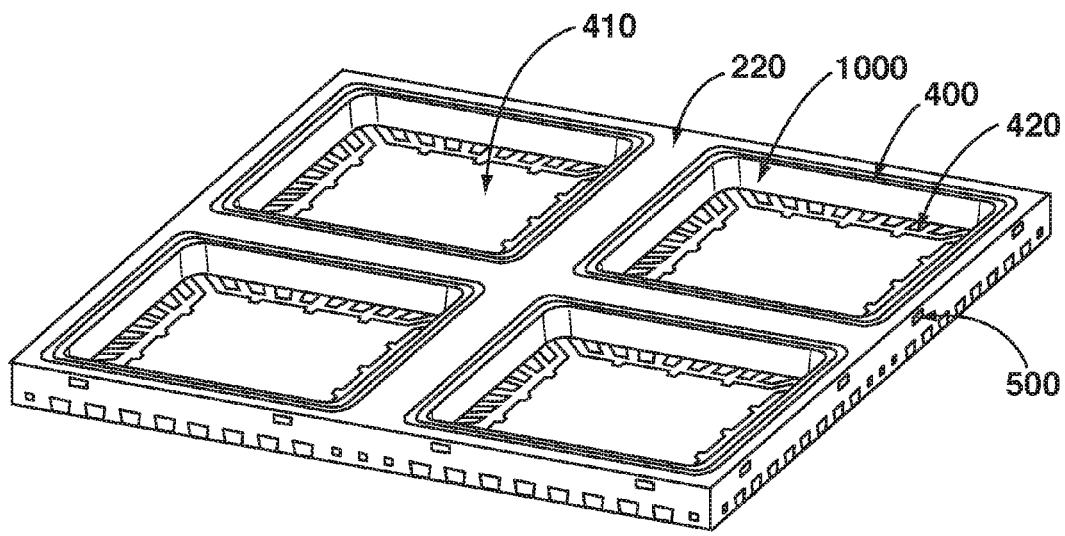
FIGS. 10A and 10B are top and bottom perspective views, respectively, of the leadframe matrix molded to create a cavity with exposed die attach pad, according to a further step of the process set forth in FIG. 1.
Figure 10B:
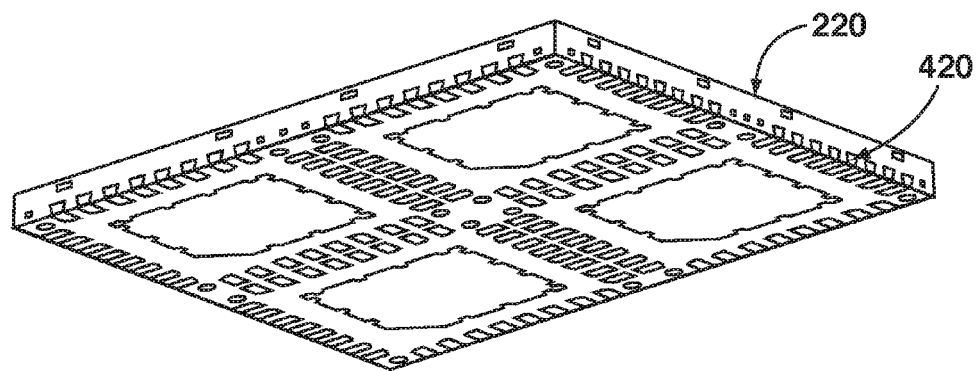

At step 140, leadframe 210 is molded in plastic molded body 220 to form a cavity 1000 for receiving the semiconductor device die in a subsequent step. The top side of the metal ring 400, a portion of the top side of the bonding fingers 420, the top side of the die attach pad 410, the bottom side of the bonding fingers 420 and the bottom side of the die attach pad 410 are all exposed after molding, as shown in FIGS. 10A and 10B.

Figure 11:
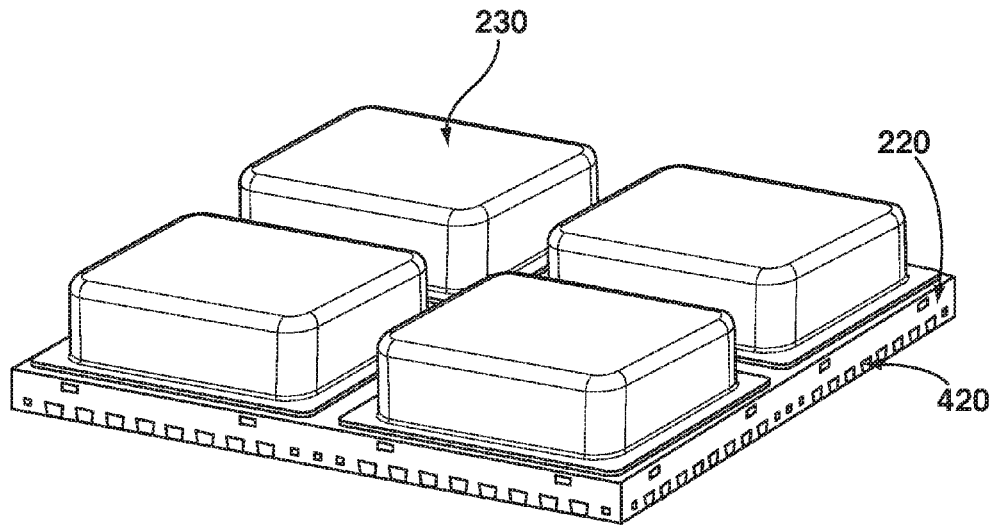
FIG. 11 is a top perspective view of the pre-molded leadframe matrix, after die attach on the respective die attach pads and wire bonding, according to a further step of the process set forth in FIG. 1, and after attachment of respective caps, according to another step of the process set forth in FIG. 1.

FIG. 11 is a top perspective view of the pre-molded leadframe matrix, after die attach on the respective die attach pads and wire bonding, according to the assembly process of steps 150-170, and before singulation according to step 180.

Figure 12:
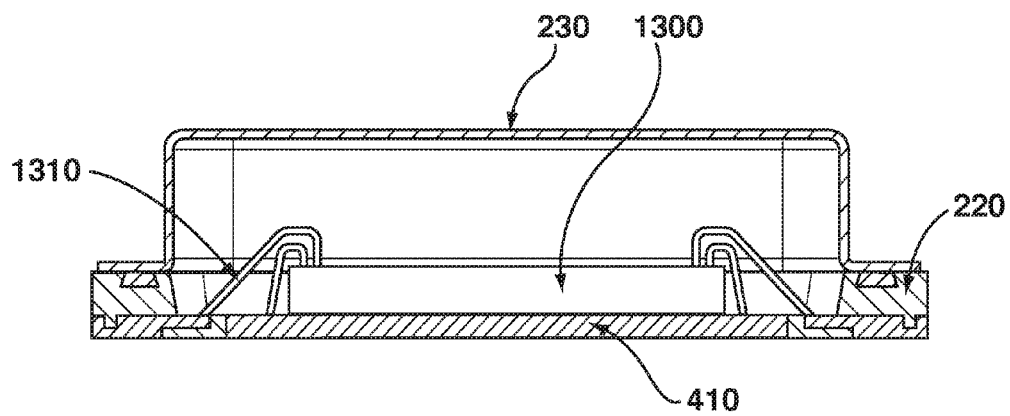
FIG. 12 is a cross-section view of a single cavity package, showing die attachment, wire bonding, and cap attachment, after singulation of the matrix according to a last step of the process set forth in FIG. 1.

The assembly process begins at step 150, wherein the semiconductor die 1300 is attached to the die attach pad 410 of the pre-molded leadframe 200, followed by wire bonding 1310, as shown in FIG. 12.

At step 160, the metal cap 230 is fabricated. Step 160 can be performed before, after or simultaneously with step 150.

At step 170, the cap 230 is attached to the top of the pre-molded cavity leadframe. The cap can be attached using conductive epoxy and solder reflow onto the exposed top surface of the metal seal ring 400 embedded into the pre-molded cavity leadframe. The metal ring 400 provides an electrical ground path from the metal cap 230 to the die attach pad 410 and permits attachment of the metal cap to the pre-molded leadframe using solder reflow.

After the cap 230 has been attached, at step 180, the matrix is singulated (e.g. using saw singulation) to create individual units.

Steps 150, 170 and 180 comprise the assembly process of the overall process of FIG. 1, following the pre-mold cavity leadframe fabrication process of steps 100-140. The cap fabrication step 160 can also form part of the pre-mold cavity leadframe fabrication process.

Referring again to step 130 of FIG. 1, it will be noted that the frame of rings 400 can be attached to the leadframe using the supporting and connecting leads 510, as discussed above and as depicted in FIGS. 6A, 6B, 7A, 7B, 9A and 9B. According to an alternative embodiment, solder balls can be used at step 130 instead of the supporting and connecting leads 510, as shown in FIGS. 13A-13E. In this alternative embodiment, step 110 is omitted.

Figure 14:
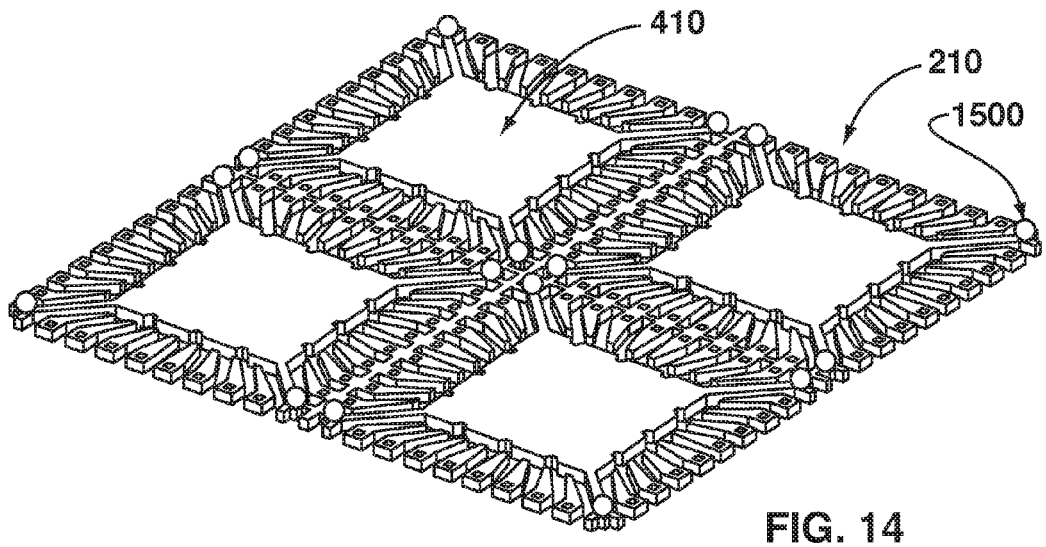
FIG. 14 is a top perspective view of the pre-molded leadframe matrix, after placement of solder balls, according to a first sub-step of an alternative of one step of the process set forth in FIG. 1.

According to a first sub-step of the alternative step 130, the solder ball contact area, the lead tips of each wire bond finger 420, and the periphery of the top surface of the die attach pad 410 on the leadframe 210 are selectively pre-plated by wire bondable and "solderable" metal (e.g. Ni/Au, Ni/Pd/Au, Ag, etc). The bottom exposed metal areas of the leadframe 210 are also selectively plated for surface mount reflow. The remainder of the non plated area of the leadframe 210 is then passivated (e.g. by oxidizing the base metal). Passivation acts as a solder resist for restricting undesired solder wetting. Solder balls 1500 are then placed as shown in FIG. 14.

Figure 15A:
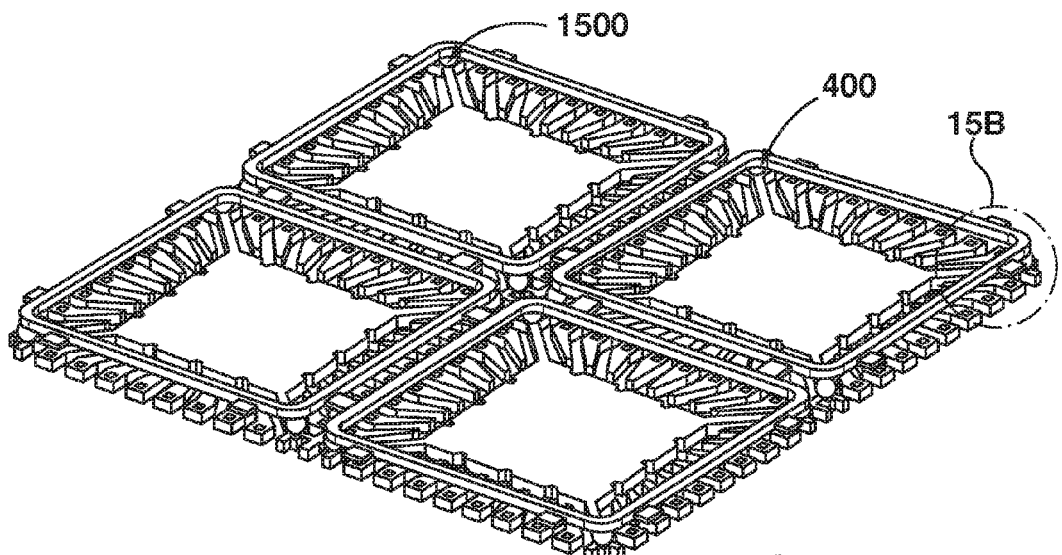
FIGS. 15A and 15B are a top perspective and a detail view, respectively, showing attachment of the frame of seal rings to the leadframe matrix via the solder balls, according to second sub-step of the alternative referred to with respect to FIG. 14.
Figure 15B:
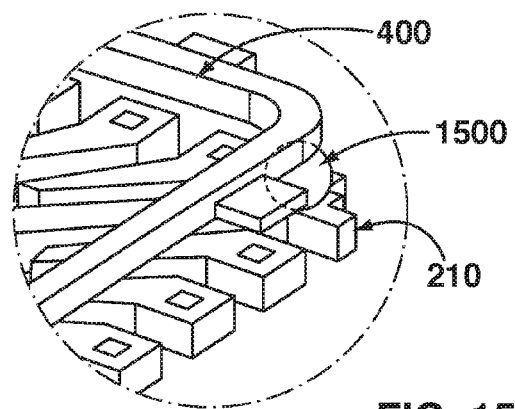

FIGS. 15A and 15B are a top perspective and a detail view, respectively, showing attachment of the frame of seal rings 400 to the leadframe matrix 210 via the solder balls 1500, according to second sub-step of the alternative step 130. The solder ball contact area at the bottom surface of the ring 400 and the top exposed area of the ring are selectively pre-plated by "solderable" metal (e.g. Ni/Au, Ni/Pd/Au, Ag, . . . etc). The rest of the non plated area of the ring is then passivated (e.g. by oxidizing the base metal), wherein passivation acts as a solder resist to restrict undesired solder wetting. The rings 400 are then soldered onto the leadframe 210 by reflowing the solder balls 1500.

While the forgoing exemplary embodiment is illustrative of the principles of the present invention, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A method of manufacturing a cavity package comprising:
   i) fabricating a frame of metal rings;
   ii) fabricating a matrix of metal leadframes;
   iii) attaching the frame of metal rings to the matrix of metal leadframes;
   iv) molding the matrix of metal leadframes and attached rings to form a plurality of substrate cavities each including an exposed die attach pad for affixing a semiconductor device, exposed lead fingers for wire bonding to the semiconductor device and to an external circuit, and an exposed top surface of the frame of metal rings;
   v) attaching a semiconductor device die to each die attach pad;
   vi) wire bonding the semiconductor device to the lead fingers;
   vii) fabricating a plurality of metal caps;
   viii) attaching the plurality of metal caps to the rings via exposed top surfaces of the frame of metal rings for protecting the wire bonded semiconductor device die and electrically grounding the caps to the matrix of metal leadframes; and
   ix) singulating the matrix into individual cavity packages.

2. The method of claim 1, further comprising forming supporting and connecting leads on the frame of metal rings.

3. The method of claim 2, wherein the frame of metal rings is attached to the matrix of metal leadframes via the supporting and connecting leads.

4. The method of claim 1, wherein the frame of metal rings is attached to the matrix of metal leadframes by reflowing solder balls placed on the matrix of metal leadframes and in contact with the rings.

* * * * *